United States Patent [19]

Isogai et al.

[11] Patent Number: 5,300,852
[45] Date of Patent: Apr. 5, 1994

[54] PIEZOELECTRIC CERAMIC LAMINATE DEVICE

[75] Inventors: Yuji Isogai, Niizashi; Hiroki Toda, Asakashi, both of Japan

[73] Assignee: Honda Giken Kogyo Kabushiki Kaisha, Tokyo, Japan

[21] Appl. No.: 956,095

[22] Filed: Oct. 2, 1992

[30] Foreign Application Priority Data

Oct. 4, 1991 [JP] Japan .................... 3-283749

[51] Int. Cl.$^5$ ............................................. H01L 41/08
[52] U.S. Cl. ..................................... 310/358; 310/328
[58] Field of Search ............................... 310/357–359, 310/328

[56] References Cited

U.S. PATENT DOCUMENTS

| | | | |
|---|---|---|---|
| 3,671,784 | 6/1972 | Mitchell | 310/358 |
| 4,570,098 | 2/1986 | Tomita et al. | 310/328 X |
| 4,686,409 | 8/1987 | Kaarmann et al. | 310/358 |
| 4,885,498 | 12/1989 | Wakita | 310/328 |
| 5,073,740 | 12/1991 | Jomura et al. | 310/358 |
| 5,111,356 | 5/1992 | Hardy | 310/358 X |

Primary Examiner—Mark O. Budd

[57] ABSTRACT

A piezoelectric ceramic laminate device constituted by a plurality of piezoelectric ceramic sheets, wherein the concentration of at least one metal component constituting the piezoelectric ceramic sheets changes substantially along a sinusoidal curve in the laminating direction thereof.

10 Claims, 11 Drawing Sheets

Ti CONCENTRATION

LAMINATING DIRECTION

Ti CONCENTRATION →

LAMINATING DIRECTION →

PIEZOELECTRIC CERAMIC LAMINATE DEVICE

BACKGROUND OF THE INVENTION

1. Field of the Invention

The present invention relates to a piezoelectric ceramic laminate device, more specifically, to a piezoelectric ceramic laminate device suitable for actuators usable in precise positioning devices of machine tools, flow-controlling valves, automobile brakes, etc.

2. Description of the Background Art

Materials which mechanically strain when an electric field (voltage) is applied thereto are generally called piezoelectric materials or electrostrictive materials, and these kinds of materials are used as electromechanical transducers in many applications such as bimorphs, piezoelectric ignition elements, ultrasonic vibrators, piezoelectric buzzers, ceramic filters, etc.

Generally, when voltage is applied to a piezoelectric material, the crystal structure of the piezoelectric material is transformed and a maximum strain (maximum electromechanical coupling constant) is obtained at its crystal transformation point. Since the crystal transformation point varies depending on the composition of the piezoelectric material used, a proper piezoelectric material should be selected depending on a temperature at which it is used.

$BaTiO_3$, $Pb(Zr,Ti)O_3$ (which is generally called PZT), $LiNbO_3$, $LiTaO_3$, etc. are known as piezoelectric materials. Also usable are those obtained by adding other metal oxides to the above piezoelectric materials to improve various properties. Further, since a PNZST-type piezoelectric material which is obtained by partially substituting Zn in the above PZT piezoelectric material with Nb and Sn strains greatly without cracking or breakage, attempts have been made to use the PNZST piezoelectric material for actuators.

However, as schematically shown by a solid line in FIG. 15, the strain of the PNZST piezoelectric material suddenly increases almost to the maximum when a certain voltage ($E_q$) is applied thereto. This means that, in practice, the strain of the PNZST piezoelectric material is controlled only at the maximum strain ($\Delta Lo$) and the minimum strain (0); in other words, the strain of the PNZST piezoelectric material is only controlled digitally. There also is a problem that a hysteresis loop of voltage vs. strain is relatively large in the PNZST piezoelectric material.

Although the above-mentioned digital control is effective in some cases, a piezoelectric material would be able to find much more applications in the field of actuators, if the analog control of the strain of the piezoelectric material can be performed, namely if the strain can be controlled at a certain point between the maximum and the minimum. To achieve the analog control of the strain, it is necessary to develop a piezoelectric material whose strain changes more gradually in proportion to the voltage applied and which has a strain/voltage hysteresis loop which is much slimmer. For instance, in the case of the PZT as shown in FIG. 16, $\Delta X/X_{max}$ should be small. Also, in the case of the PNZST as shown in FIG. 17, it is needed to have a strain changeable by a small $\Delta L$ relative to the change of voltage $\Delta E$.

OBJECT AND SUMMARY OF THE INVENTION

Accordingly, an object of the present invention is to provide a piezoelectric ceramic laminate device whose strain changes rather gradually in proportion to the voltage applied, thereby making it possible to control strain in a analog manner, and whose hysteresis loop is relatively slim.

As a result of intense research in view of the above object, the inventors have found that when two or more types of piezoelectric ceramic sheets having metal components with different concentrations are laminated such that the metal concentrations change in the laminating direction, strain which takes place when voltage applied thereto changes gradually in proportion to the voltage applied. The present invention has been completed based upon this finding.

Accordingly, the piezoelectric ceramic laminate device of the present invention is constituted by a plurality of piezoelectric ceramic sheets, wherein the concentration of at least one metal component constituting the piezoelectric ceramic sheets changes in the laminating direction thereof.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein:

FIG. 1 (b) is a schematic illustration of the change of Ti concentration in the piezoelectric ceramic laminate device before burning;

FIG. 1 (c) is a schematic illustration of the change of Ti concentration in the piezoelectric ceramic laminate device after burning;

FIG. 4 (b) is a schematic illustration of the change of Ti concentration in the piezoelectric ceramic laminate device before burning;

FIG. 4 (c) is a schematic illustration of the change of Ti concentration in the piezoelectric ceramic laminate device after burning;

FIG. 9 (b) is a graph showing the relation between the temperature and the strain in the piezoelectric ceramic laminate device of the present invention constituted by PMNPT-type ceramic sheets of different compositions;

FIG. 13 (b) is a graph showing the change of Ti concentration in the laminating direction of the piezoelectric ceramic laminate device of Example 3 which was burned at 1100° C.;

FIG. 13 (c) is a graph showing the change of Ti concentration in the laminating direction of the piezoelectric ceramic laminate device of Example 3 which was burned at 1200° C.;

DETAILED DESCRIPTION OF THE INVENTION

The present invention will be explained in detail referring to the attached figures.

Any piezoelectric ceramics can be used in the present invention as materials for piezoelectric ceramic sheets which are piled up to form a laminate as long as they have an electrostrictive effect, and Pb-Nb-Zr-Sn-Ti oxides (PNZST-type ceramics), Pb(Zr,Ti)O₃ oxides (PZT-type ceramics), Pb-La-Zr-Ti oxides (PLZT-type ceramics), Pb-Mg-Nb-PbTiO₃ (PMNPT-type ceramics), etc. are preferable.

As a preferred embodiment of the present invention, a piezoelectric ceramic laminate device which uses Pb-Nb-Zr-Sn-Ti oxides (PNZST-type ceramics) for piezoelectric ceramic sheets is explained in detail below.

The Pb-Nb-Zr-Sn-Ti oxide (PNZST-type ceramic) usable in the present invention has a composition represented by the general formula:

$Pb_\alpha Ba_\beta Nb_\gamma [(Zr_\delta Sn_\epsilon)_{1-\zeta} Ti_\zeta]_\eta O_3$, wherein $\alpha$, $\beta$, $\gamma$, $\delta$, $\epsilon$, $\zeta$ and $\eta$ respectively satisfy, by atomic ratio, $0.94 < \alpha < 1$, $0 < \beta < 0.06$, $0 < \gamma < 0.04$, $0.55 < \delta < 0.75$, $0.25 < \epsilon < 0.45$, $0 < \zeta < 0.08$ and $0.96 < \eta < 1$.

Figure 1A:
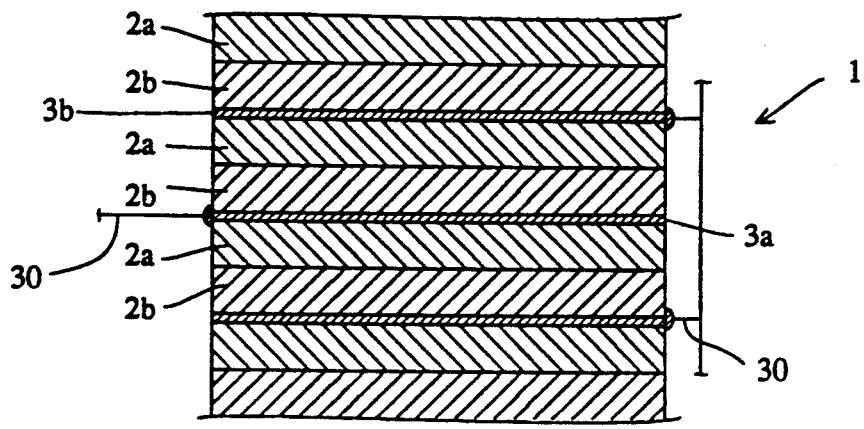
FIG. 1 (a) is a partial sectional view showing the piezoelectric ceramic laminate device according to one embodiment of the present invention.

The piezoelectric ceramic sheets constituting the piezoelectric ceramic laminate device of the present invention can have different compositions which vary only in concentrations of particular components within the above ranges. For example, a piezoelectric ceramic laminate device 1 shown in FIG. 1(a) is formed by laminating laminate units each of which contains two types of piezoelectric ceramic sheets 2a and 2b disposed between electrodes 3a and 3b and pressed together.

Figure 1B:
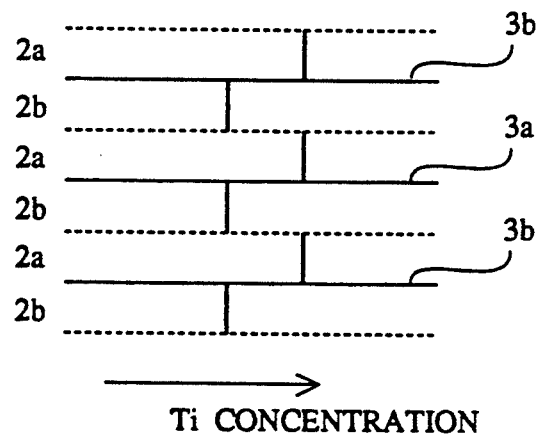

In this embodiment, the piezoelectric ceramic sheets 2a and 2b are different from each other in Ti concentration (correspondingly in concentrations of Zn and Sn). As seen in FIG. 1(b), the piezoelectric ceramic sheet 2a has higher Ti concentration than the piezoelectric ceramic sheet 2b.

The preferred composition of the piezoelectric ceramic sheets 2a and 2b is represented by the formula:

$Pb_{0.96}Ba_{0.03}Nb_{0.02}[(Zr_{0.65}Sn_{0.35})_{1-\zeta}Ti_\zeta]_{0.98}O_3$, wherein $\zeta$ satisfies, by atomic ratio, $0 < \zeta \leq 0.08$. Various ceramic sheets 2a and 2b having the above composition in which $\eta$ varies within the above range can be combined. Specifically, the preferred compositions of the piezoelectric ceramic sheets 2a and 2b are as follows:

2a: $Pb_{0.96}Ba_{0.03}Nb_{0.02}[(Zr_{0.65}Sn_{0.35})_{0.95}Ti_{0.05}]_{0.98}O_3$, and
2b: $Pb_{0.96}Ba_{0.03}Nb_{0.02}[(Zr_{0.65}Sn_{0.35})_{0.96}Ti_{0.04}]_{0.98}O_3$.

Incidentally, the amounts of Pb and Ba can be changed instead of the amount of Ti. In this case, the preferred composition of the piezoelectric ceramic sheet is represented, for instance, by the following formula:

$Pb_{0.99-\beta}Ba_\beta Nb_{0.02}[(Zr_{0.65}Sn_{0.35})_{0.95}Ti_{0.05}]_{0.98}O_3$, wherein $\beta$ satisfies, by atomic ratio, $0 \leq \beta \leq 0.06$.

Further modifications can be obtained by varying the amounts of Pb and Nb. In this case, the preferred composition of the piezoelectric ceramic sheet is represented, for instance, by the following formula:

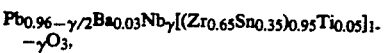

$Pb_{0.96-\gamma/2}Ba_{0.03}Nb_\gamma[(Zr_{0.65}Sn_{0.35})_{0.95}Ti_{0.05}]_{1-\gamma}O_3$, wherein $\gamma$ satisfies, by atomic ratio, $0 < \gamma \leq 0.04$.

Moreover, a still further modification can be obtained by varying the amounts of Zr and Sn without changing the amount of Ti. In this case, the preferred composition of the piezoelectric ceramic sheet is represented, for instance, by the following formula:

$Pb_{0.96}Ba_{0.03}Nb_{0.02}[(Zr_\delta Sn_{1-\delta})_{0.95}Ti_{0.05}]_{0.98}O_3$, wherein $\delta$ satisfies, by atomic ratio, $0.55 \leq \delta \leq 0.75$.

Figure 17:
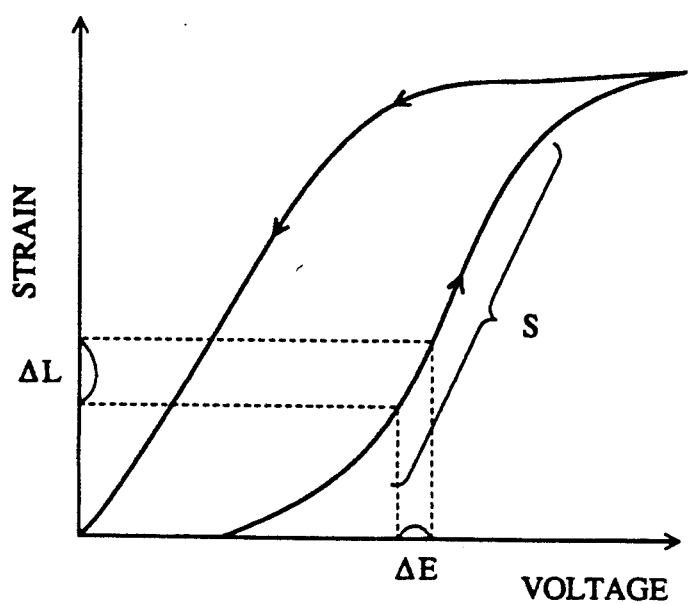
FIG. 17 is a graph schematically showing a typical hysteresis loop of voltage vs. strain in a piezoelectric ceramic laminate device.

As described above, a plurality of piezoelectric ceramic sheets which are varied in the concentration of at least one metal component are laminated in the piezoelectric ceramic laminate device of the present invention. In case that Pb-Nb-Zr-Sn-Ti oxides are used for piezoelectric ceramic sheets, it is preferable to produce two or more types of piezoelectric ceramic sheets by varying Ti concentration (accordingly the concentrations of Zn and Sn) as in the above embodiment. By laminating piezoelectric ceramic sheets having different Ti concentrations, a gradient of the curve portion S of a hysteresis loop of voltage vs. strain in FIG. 17 can be made smaller, and the hysteresis loop itself can be made slimmer.

Incidentally, the thickness of each piezoelectric ceramic sheet $2a$, $2b$ is preferably between 10-250 $\mu$m, and more preferably about 100 $\mu$m.

The electrodes $3a$ and $3b$ are formed from noble metals such as platinum, silver, palladium, silver-palladium alloy, etc., and among them, platinum is most preferable. The electrodes $3a$ and $3b$ are respectively formed on one surface of a laminate unit consisting of the piezoelectric ceramic sheets $2a$ and $2b$ by a screen printing method, etc., as explained in detail later. The thickness of each electrode $3a$, $3b$ is preferably between 1-10 $\mu$m, and more preferably about 5 $\mu$m.

When two types of piezoelectric ceramic sheets which are different from each other in concentrations of metal components are laminated and burned, the metal components diffuse so that the change of the metal concentrations becomes more smooth. For instance, by burning the laminate in which the Ti concentration changes stepwise as shown in FIG. 1(b), the change of the Ti concentration in the piezoelectric ceramic laminate device 1 turns from a stepwise one to a sinusoidal one 6 shown in FIG. 1(c).

Figure 1C:
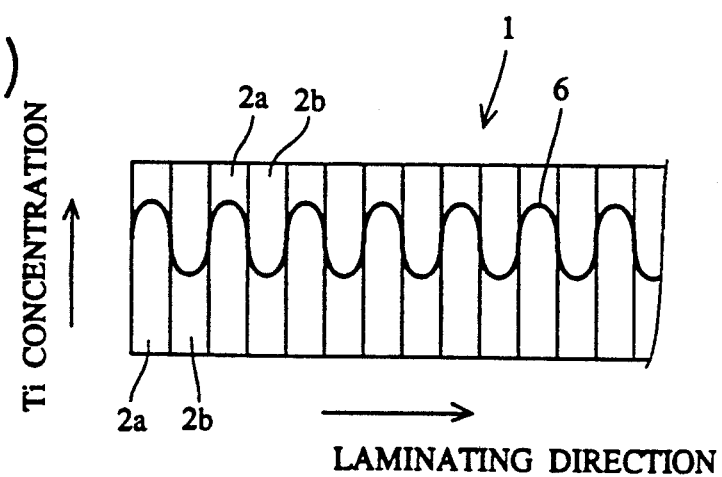
Figure 15:
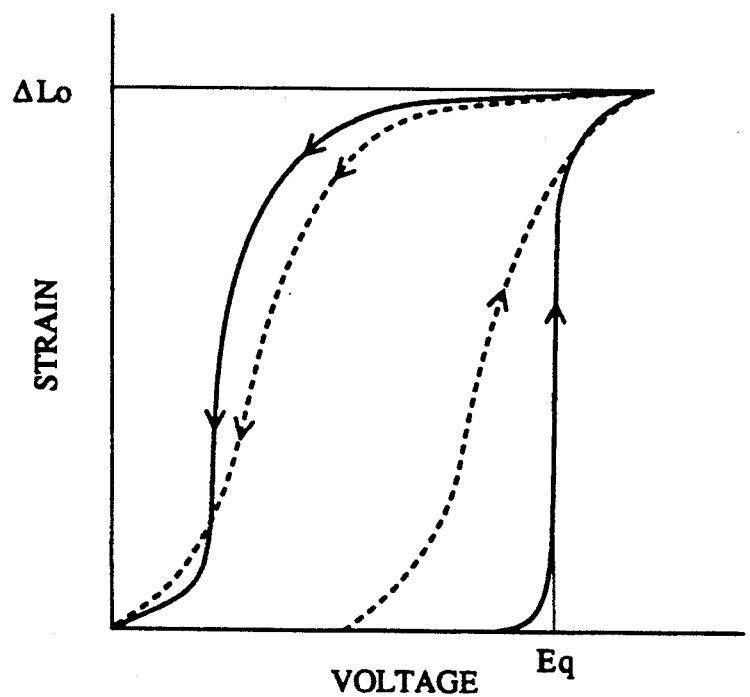
FIG. 15 is a schematic illustration of hysteresis loops of voltage vs. strain in the piezoelectric ceramic laminate devices made of PNZST-type ceramics, wherein the solid line shows a case where the laminate is made from piezoelectric ceramic sheets having the same composition, and the dotted line shows a case where the laminate is made from a plurality of piezoelectric ceramic sheets having different metal compositions.
Figure 16:
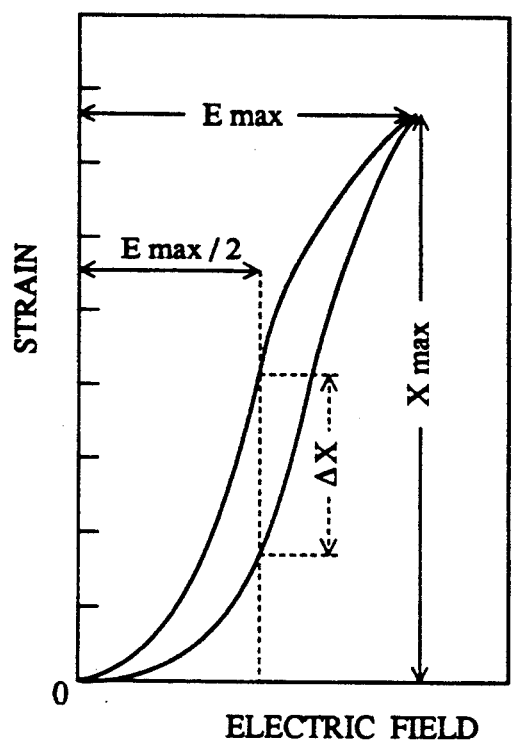
FIG. 16 is a graph schematically showing a typical hysteresis loop of electric field vs. strain in a piezoelectric ceramic laminate device.

The piezoelectric ceramic laminate device 1 having the change of the Ti concentration shown in FIG. 1(c) has a hysteresis loop of voltage vs. strain which is more slanted and slimmer than that of a conventional PNZST-type piezoelectric ceramic laminate device, as seen in FIG. 15 wherein the dotted line shows the hysteresis loop of the present invention and the solid line shows that of the conventional piezoelectric ceramic laminate device.

The reason why the piezoelectric ceramic laminate device according to the present invention can have such a hysteresis loop can be explained as follows: Generally, a phase-transformation electric field of a piezoelectric material (corresponding to an electric field in a region of the hysteresis loop in which the strain rises) varies depending on concentrations of its metal components. By laminating a plurality of piezoelectric ceramic sheets having different compositions wherein the concentrations of the metal components vary, the resulting laminate shows a hysteresis loop which is obtained by synthesizing the hysteresis loops of different piezoelectric ceramic sheets. As a result, the strain/voltage hysteresis loop of the resulting laminate has a large inclination; the rising part of the hysteresis loop is more slanted.

In addition to the lamination of two types of piezoelectric ceramic sheets described above, three types or more of piezoelectric ceramic sheets having different compositions which vary in concentrations of the metal components may be laminated. For example, three types of piezoelectric ceramic sheets having different metal concentrations may be laminated as schematically illustrated in FIGS. 2 and 3.

Figure 2:
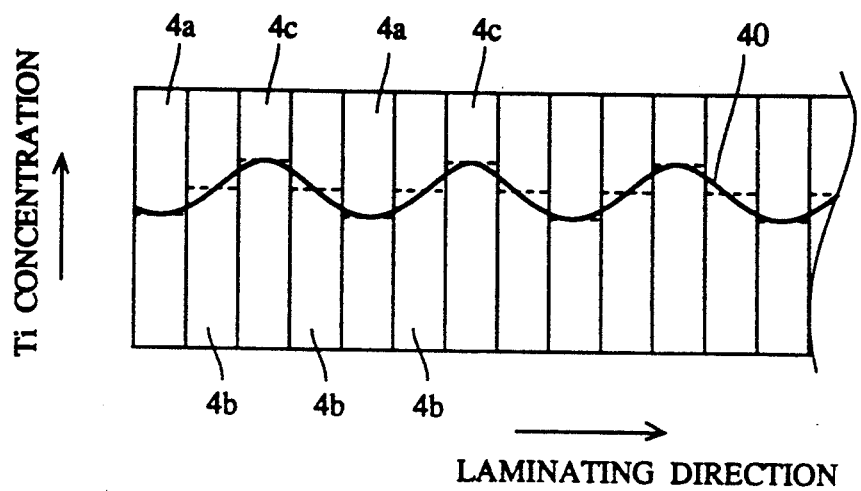
FIG. 2 is a schematic illustration of the change of Ti concentration in the piezoelectric ceramic laminate device after burning according to another embodiment of the present invention.

In the embodiment of FIG. 2, three types of piezoelectric ceramic sheets $4a$, $4b$ and $4c$ having different Ti concentrations are laminated in the order of $4a$, $4b$, $4c$, $4b$, $4a$ .... In FIG. 2, a curve 40 denotes the Ti concentration after burning and a dotted line denotes that before burning.

Figure 3:
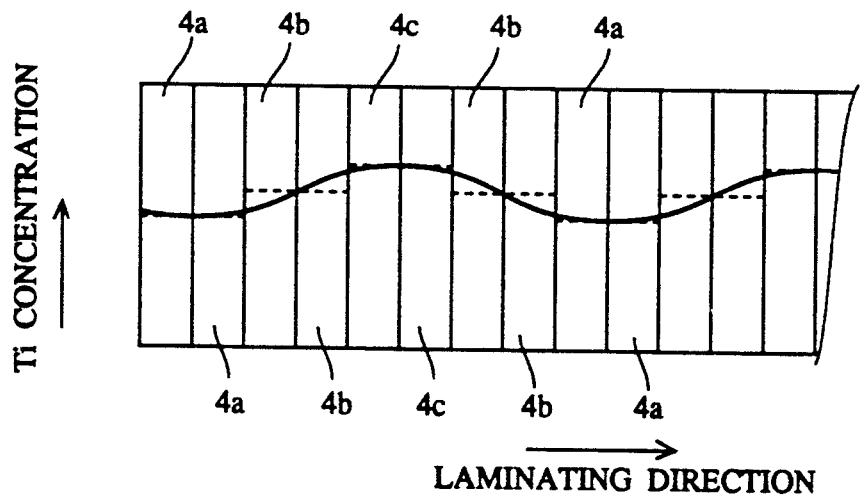
FIG. 3 is a schematic illustration of the change of Ti concentration in the piezoelectric ceramic laminate device after burning according to a still further embodiment of the present invention.

In the embodiment of FIG. 3, three types of piezoelectric ceramic sheets are laminated in the order of $4a$, $4a$, $4b$, $4b$, $4c$, $4c$, $4b$, $4b$, $4a$, $4a$ ... so that a layer consisting of piezoelectric ceramic sheets having the same composition has a larger thickness, thereby making the change of Ti concentration in the entire laminate more moderate. Further by modifying the laminate in FIG. 3 such that each layer is constituted by three or more of the same piezoelectric ceramic sheets, the change of Ti concentration becomes more moderate.

Figure 4A:
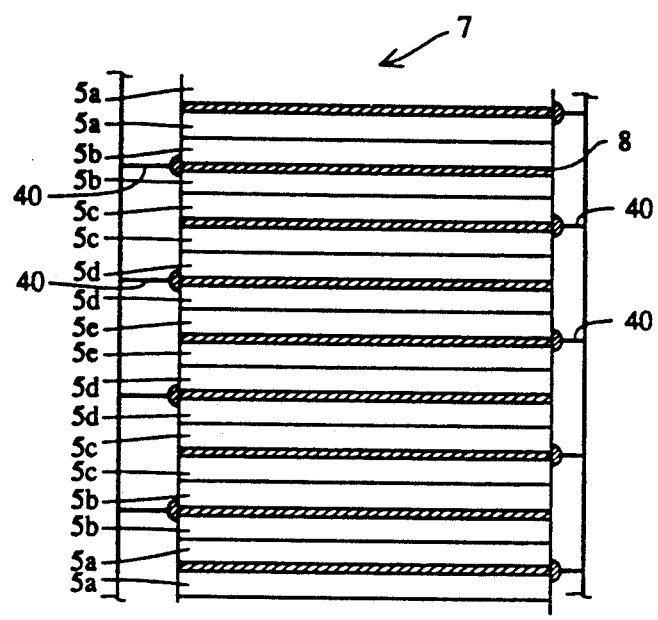
FIG. 4 (a) is a partial sectional view showing the piezoelectric ceramic laminate device according to a still further embodiment of the present invention.

FIGS. 4(a) and (b) show the piezoelectric ceramic laminate device 7 according to a further embodiment of the present invention which is produced by laminating and compressing five types of piezoelectric ceramic sheets having different Ti concentrations in the order of $5a$, $5a$, $5b$, $5b$, $5c$, $5c$, $5d$, $5d$, $5e$, $5e$, $5d$, $5d$, $5c$, $5c$, $5b$, $5b$, $5a$, $5a$ .... Electrodes 8, 8 ... are disposed between every pair of the same sheets. Lead wires 40, 40 are connected to the electrodes 8, 8 alternately.

The preferred compositions of the piezoelectric ceramic sheets $5a$, $5b$, $5c$, $5d$ and $5e$ are as follows:

$5a$: $Pb_{0.96}Ba_{0.03}Nb_{0.02}[(Zr_{0.65}Sn_{0.35})_{0.9725}Ti_{0.0275}]_{0.98}O_3$,
$5b$: $Pb_{0.96}Ba_{0.03}Nb_{0.03}[(Zr_{0.65}Sn_{0.35})_{0.96875}Ti_{0.03125}]_{0.98}O_3$,
$5c$: $Pb_{0.96}Ba_{0.03}Nb_{0.02}[(Zr_{0.65}Sn_{0.35})_{0.965}Ti_{0.035}]_{0.98}O_3$,
$5d$: $Pb_{0.96}Ba_{0.03}Nb_{0.02}[(Zr_{0.65}Sn_{0.35})_{0.96125}Ti_{0.03875}]_{0.98}O_3$, and
$5e$: $Pb_{0.96}Ba_{0.03}Nb_{0.02}[(Zr_{0.65}Sn_{0.35})_{0.9575}Ti_{0.0425}]_{0.98}O_3$.

Figure 4B:
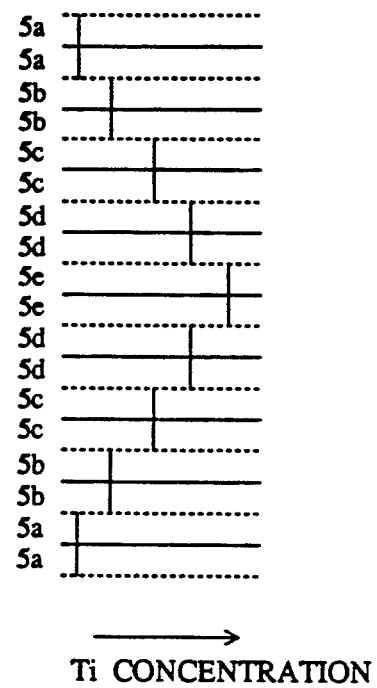
Figure 4C:
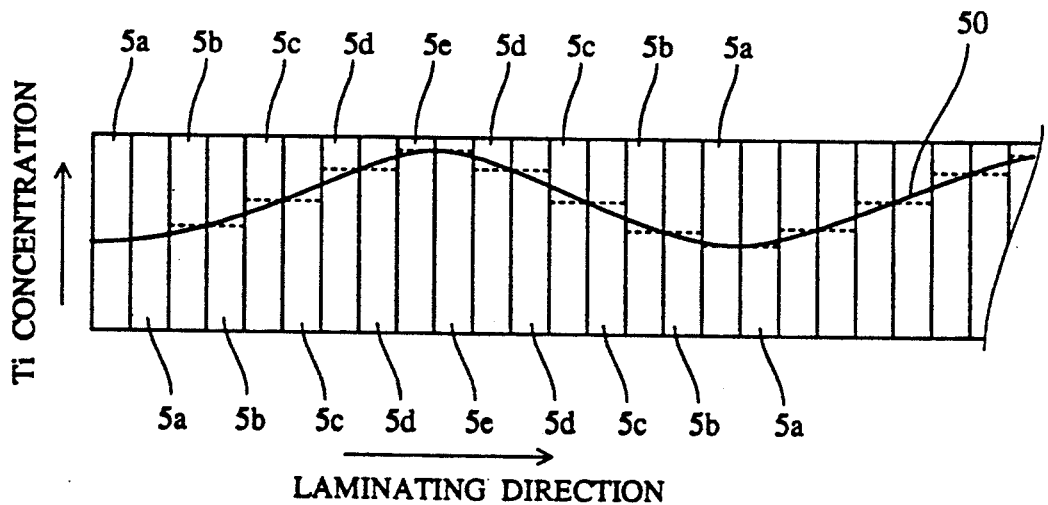

As seen in FIG. 4(c), the Ti concentration in the laminate after burning changes substantially along a sinusoidal curve 50. Incidentally, the dotted line in FIG. 4(c) shows the Ti concentration before burning.

In the piezoelectric ceramic laminate device 7 shown in FIGS. 4(a)–(c) in which the Ti concentration changes substantially along a sinusoidal curve, there is little deviation of equipotential surfaces into regions of higher Ti concentration, resulting in a more smooth hysteresis loop.

Figure 5:
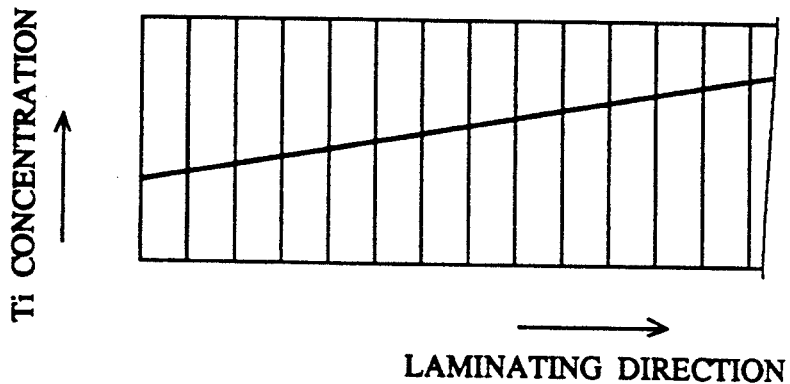
FIG. 5 is a schematic illustration of the change of Ti concentration in the piezoelectric ceramic laminate device after burning according to a still further embodiment of present invention.

Furthermore, a plurality of piezoelectric ceramic sheets having a gradually increasing metal (Ti) concentration may be laminated as shown in FIG. 5.

In the above embodiments shown in FIGS. 2-5, the Ti concentration changes in the laminating direction, but it should be noted that the concentrations of any components other than Ti may change to provide the piezoelectric ceramic laminate devices according to the present invention.

Next, the method of producing the piezoelectric ceramic laminate device of the present invention is explained below in detail, with respect to a case in which two types of piezoelectric ceramic sheets are used for simplicity of explanation. However, it should be noted that the piezoelectric ceramic laminate device of the present invention can be obtained by using three or more types of piezoelectric ceramic sheets by essentially the same method.

First, a piezoelectric ceramic sheet having a predetermined composition is produced by the following process: $PbO$, $BaCO_3$, $Nb_2O_5$, $ZrO_2$, $SnO_2$ and $TiO_2$ in certain amounts are blended in a solvent such as ethanol, etc. in a ball mill for about 10–50 hours. The resulting mixture is dried and calcinated at 800°–900° C. for 2–10 hours. The mixture is further ball-milled in solvent such as ethanol, etc. for about 10–50 hours. After drying, the mixture is again calcinated at 900°–1000° C. for 2–10 hours and ball-milled in a solvent such as ethanol, etc. for about 10–100 hours. The resulting powder mixture is dried to obtain a material (hereinafter called as "calcinated powder") usable for the formation of the piezoelectric ceramic sheet.

The starting powder materials and the calcinated powder preferably have smaller particle sizes. Specifically, an average diameter of each of the above particles is preferably about 1 μm or less. The smaller the particles, the larger the diffusion of a metal component such as Ti in the piezoelectric ceramic laminate, thereby improving the properties of the resulting piezoelectric ceramic laminate device.

A green sheet is produced from the above calcinated powder as follows: First, a solvent such as ethylene glycol monoethyl ether, diethylene glycol n-butyl ether, etc. and a plasticizer such as a butyl phthalyl butyl glycolate are blended, and after adding the calcinated powder, the mixture is stirred for about 5–60 minutes. Further, a binder such as polyvinyl butyral, etc. is added to the above mixture and the resulting mixture is stirred for about 20–120 minutes while heating at about 80° C. After filtering the above mixture, preferably with a 200-mesh screen, defoaming is conducted to obtain a slurry for casting.

A sheet is formed from the above slurry by a doctor blade method, etc. After drying the cast ceramic sheet, a green sheet having a predetermined shape is blanked out of the sheet. The thickness of the resulting green sheet is preferably about 100 μm.

Figure 6:
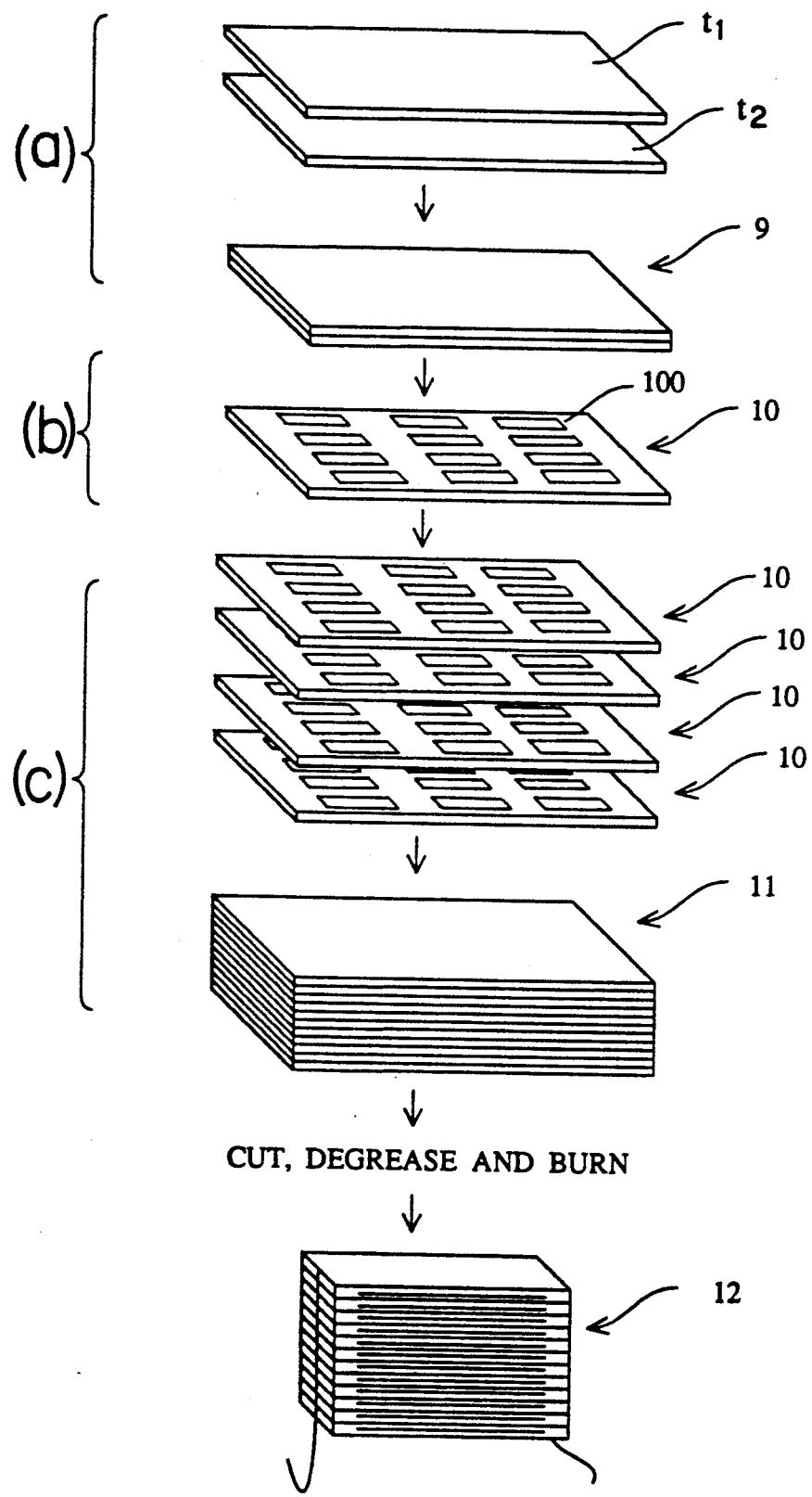
FIG. 6 is a schematic illustration of the procedure of producing the piezoelectric ceramic laminate device according to one embodiment of the present invention.

Two types of ceramic green sheets are produced by the above method, and then as schematically shown in FIG. 6, a laminate is made in the following procedure: First, two green sheets $t_1$ and $t_2$ having different Ti concentrations are pressed together to obtain a laminate unit 9 (step (a)). And then, an electrode 100 is formed on one surface (for example, on the surface of the sheet $t_1$ which has a higher Ti concentration) of the laminate unit 9 by a screen printing method, etc. (step (b)). As described before, the electrode is preferably made from platinum. In case that the electrode is made by a screen printing method, it is preferable to use a platinum paste having 60% by weight of platinum and 40% by weight of an organic binder.

A plurality of laminate units 10 having the electrode 100 are laminated and pressed together (step (c)). Then, the resulting laminate 11 is cut in a laminating direction followed by defoaming and burning. In the defoaming step, the highest temperature is preferably 1000° C. or less, more preferably 500° C. or less. During the defoaming, the temperature should be gradually raised from room temperature to the highest temperature as exemplified by a heating-cooling pattern in FIG. 8.

After the defoaming, the laminate is burned at 1000°–1270° C. for 2–6 hours. During the burning, Ti diffuses between the ceramic sheets, so that the change of Ti concentration in the entire laminate becomes from a stepwise one to a smooth one. The preferred burning temperature is between 1100° C. and 1200° C. An aimed piezoelectric ceramic laminate device 12 is attained by connecting a lead wire 30 to each of the platinum electrodes 3a, 3b . . . as shown in FIG. 1.

When a density of each ceramic sheet of the laminate is as low as 95–97% of the theoretical density, it is desirable to conduct a low-temperature HIP treatment at 850°–1100° C. and at about 1000–2000 atm for 3–10 hours. The HIP is preferably conducted in an atmosphere of an argon gas and an oxygen gas having an $Ar/O_2$ proportion, by weight, of 4 to 1. By conducting the above HIP, the density of each ceramic sheet of the laminate can be raised to 99% or more, thereby improving the properties of the entire laminate. If the HIP temperature exceeds 1100° C., excess diffusion of Ti takes place between the adjacent ceramic sheets.

The piezoelectric ceramic laminate device according to the present invention can be produced not only from Pb-Nb-Zr-Sn-Ti oxides but also from PZT oxides, PLZT oxides and PMNPT oxides.

PZT-type ceramics usable in the present invention preferably have a composition represented by the general formula:

$$Pb_{1-A}M_A[(Zr_{1-B}Ti_B)_{1-C}(Mg_{\frac{1}{3}}Nb_{\frac{2}{3}})_C]O_3,$$

wherein M represents Ba, Sr or Ca and A, B and C respectively satisfy, by atomic ratio, $0 \leq A \leq 0.2$, $0.3 \leq B \leq 0.5$ and $0.01 \leq C \leq 0.5$.

Incidentally, a portion represented by $(Mg_{\frac{1}{3}}Nb_{\frac{2}{3}})$ in the above formula can be substituted with one of the following: $(Cd_{\frac{1}{3}}Nb_{\frac{2}{3}})$, $(Fe_{\frac{1}{3}}Nb_{\frac{2}{3}})$, $(Yb_{\frac{1}{3}}Nb_{\frac{2}{3}})$, $(Yb_{\frac{1}{3}}Ta_{\frac{2}{3}})$, $(In_{\frac{1}{3}}Nb_{\frac{2}{3}})$, $(Mn_{\frac{1}{3}}W_{\frac{2}{3}})$, $(Zn_{\frac{1}{3}}W_{\frac{2}{3}})$, $(Mg_{\frac{1}{3}}W_{\frac{2}{3}})$, $(Co_{\frac{1}{3}}W_{\frac{2}{3}})$, $(Ni_{\frac{1}{3}}W_{\frac{2}{3}})$, $(Ni_{\frac{1}{3}}Nb_{\frac{2}{3}})$, $(Mg_{\frac{1}{3}}Ta_{\frac{2}{3}})$, $(Zn_{\frac{1}{3}}Nb_{\frac{2}{3}})$, $(Co_{\frac{1}{3}}Nb_{\frac{2}{3}})$, $(Co_{\frac{1}{3}}Ta_{\frac{2}{3}})$, $(Ni_{\frac{1}{3}}Ta_{\frac{2}{3}})$, etc.

PLZT-type ceramics usable in the present invention preferably have a composition represented by the general formula:

$$Pb_{1-D}La_D(Zr_{1-E}Ti_E)O_3,$$

wherein D and E respectively satisfy, by atomic ratio, $0.01 \leq D \leq 0.14$, and $0.3 \leq E \leq 0.5$. Although a great strain has been achieved in the conventional PLZT-type ceramics by applying a relatively low voltage, there has been a risk of a breakage. However, by laminating a plurality of PLZT-type ceramics having different compositions in which metal components vary within the above-described ranges, the hysteresis loop becomes slimmer, thereby reducing the risk of a breakage.

Figure 9A:
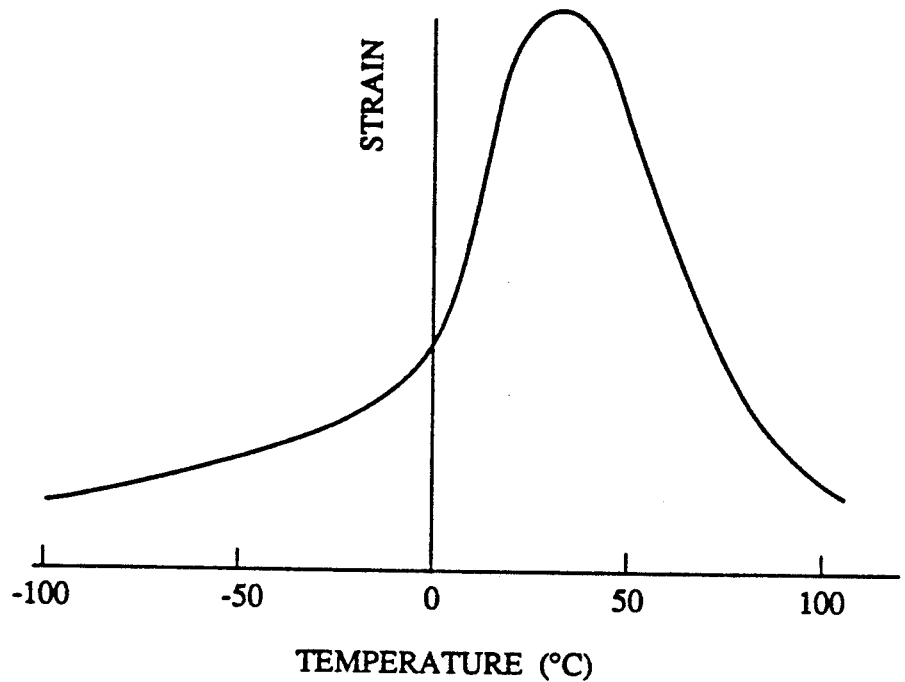
FIG. 9 (a) is a graph showing the relation between the temperature and the strain in a conventional piezoelectric ceramic laminate device constituted by PMNPT-type ceramic sheets of the same composition.
Figure 9B:
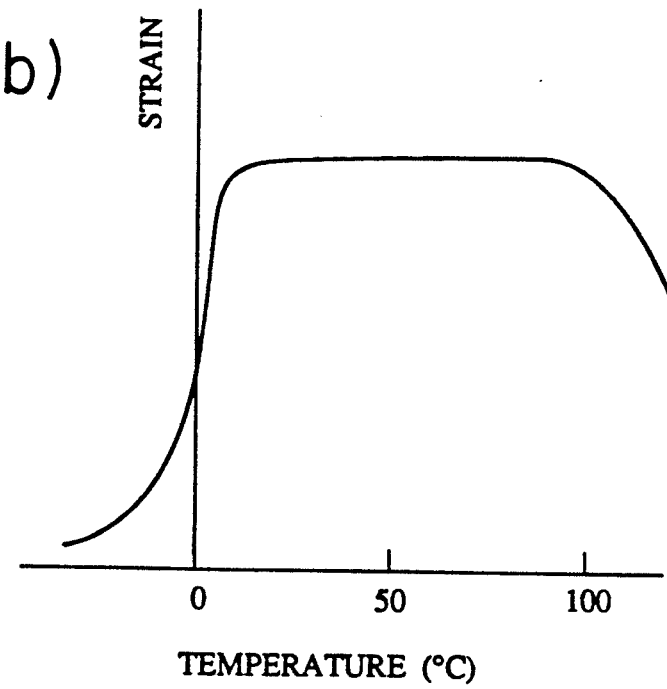

PMNPT-type ceramics usable in the present invention preferably have a composition represented by the general formula:

$$Pb_{1-F}M_F[(Mg_{\frac{1}{3}}Nb_{\frac{2}{3}})_{1-G}Ti_G]O_3,$$

wherein F and G respectively satisfy, by atomic ratio, $0 \leq F \leq 0.2$, and $0.05 \leq G \leq 0.15$. Conventional PMNPT-type ceramics have a rather slim hysteresis loop, however as shown in FIG. 9 (a), their strain is greatly influenced by the environmental temperature. By laminating a plurality of PMNPT-type ceramics having different compositions in which metal components vary within the above ranges, the strain/temperature characteristic is improved as shown in FIG. 9 (b), so that strain of a certain constant level can be utilized in a wide range of the environmental temperature.

In cases that piezoelectric ceramic sheets made from PZT-type ceramics, PLZT-type ceramics or PMNPT-type ceramics are used, the piezoelectric ceramic laminate device according to the present invention can be produced in the same manner as in the case of the PNZST-type ceramics.

The present invention is explained in further detail by the following examples.

EXAMPLE 1

As starting powder materials, PbO, BaCO$_3$, Nb$_2$O$_5$, ZrO$_2$, SnO$_2$ and TiO$_2$ were blended in a ball mill with an ethanol solvent for 24 hours to provide two kinds of mixed powders having the following compositions:

(1) Pb$_{0.96}$Ba$_{0.03}$Nb$_{0.02}$[(Zr$_{0.65}$Sn$_{0.35}$)$_{0.95}$Ti$_{0.05}$]$_{0.98}$O$_3$, and
(2) Pb$_{0.96}$Ba$_{0.03}$Nb$_{0.02}$[(Zr$_{0.65}$Sn$_{0.35}$)$_{0.96}$Ti$_{0.04}$]$_{0.98}$O$_3$.

Each of the resulting mixtures was dried at 80° C. under reduced pressure, and calcinated at 850°–950° C. for 10 hours. Then each mixture was ball-milled in an ethanol solvent for 24 hours.

After drying, each mixture was calcinated at 900°–1000° C. for 10 hours, and then ball-milled in an ethanol solvent for 48 hours. The mixtures were dried to obtain two kinds of calcinated powders, which were used as starting materials for piezoelectric ceramic sheets.

Each of the above powders was processed as follows: 48 ml of ethylene glycol monoethyl ether and 8 ml of diethylene glycol n-butyl ether as solvents and 1 ml of butyl phthalyl butyl glycolate as a plasticizer were blended first, and after adding 100 g of the calcinated powder, the mixture was stirred for 5 minutes.

5 g of polyvinyl butyral as a binder was added to the above mixture and the resulting mixture was stirred for 20 minutes while heating at about 80° C. After filtering the above mixture with a 200-mesh screen, defoaming was conducted to obtain a slurry for casting.

A sheet was formed from the above slurry by a doctor blade method. After drying the cast ceramic sheets at room temperature for 50 hours, green sheets each having a predetermined shape were blanked out of the sheets. The resulting green sheets had a thickness of about 120 μm.

Next, two of the resulting green sheets having different compositions were pressed together, and a platinum electrode having a dry thickness of 12 μm was formed on one surface of the bonded green sheets which had higher Ti concentration by a screen printing method using a platinum paste having 60% by weight of platinum powder and 40% by weight of an organic binder.

The thus formed laminate units composed of two green sheets and one platinum electrode were laminated as shown in FIG. 6 and a load of 50 kg/cm$^2$ was applied to them at 110° C. to produce an integral piezoelectric ceramic laminate. The resulting piezoelectric ceramic laminate was cut in the laminating direction to have a size of a 5-mm length, 10-mm width and 8-mm thickness.

Figure 8:
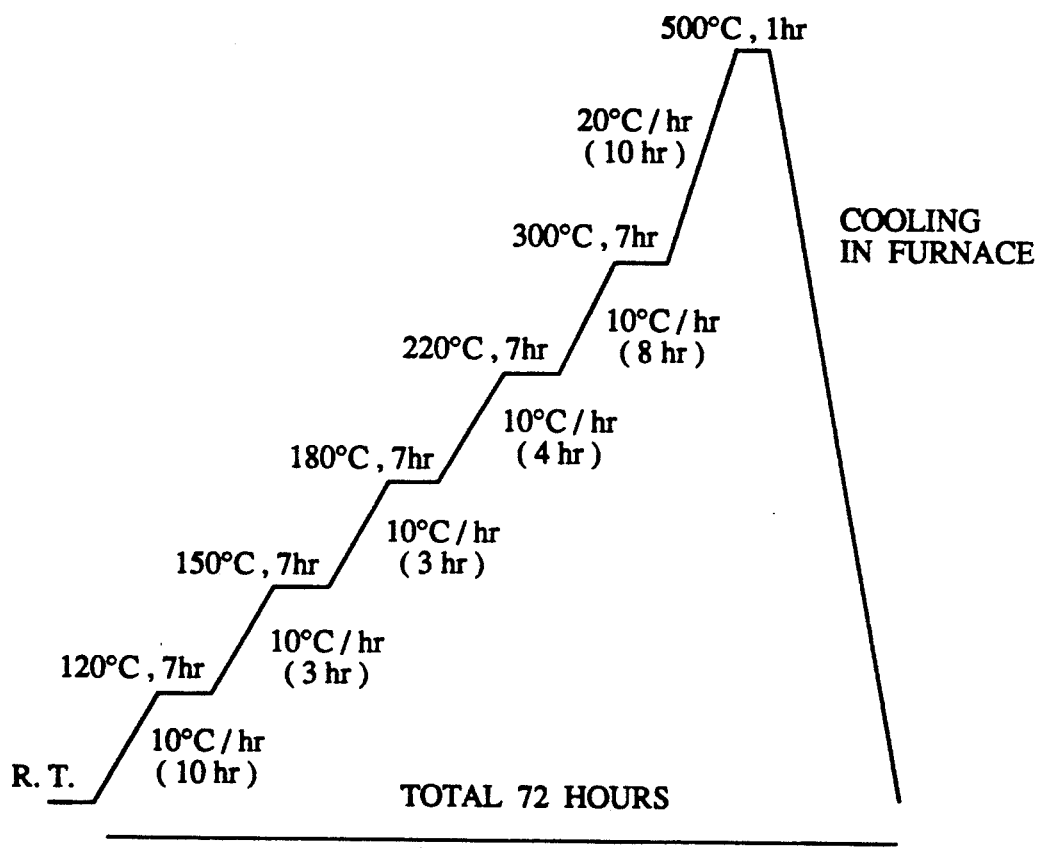
FIG. 8 is a graph showing a pattern of heat treatment for degreasing the piezoelectric ceramic laminate.

The resulting laminate was degreased under the conditions shown in FIG. 8 and burned at 1060° C. for 3 hours in the air. A lead wire was connected to each of the electrodes to attain an aimed piezoelectric ceramic laminate device.

Figure 10:
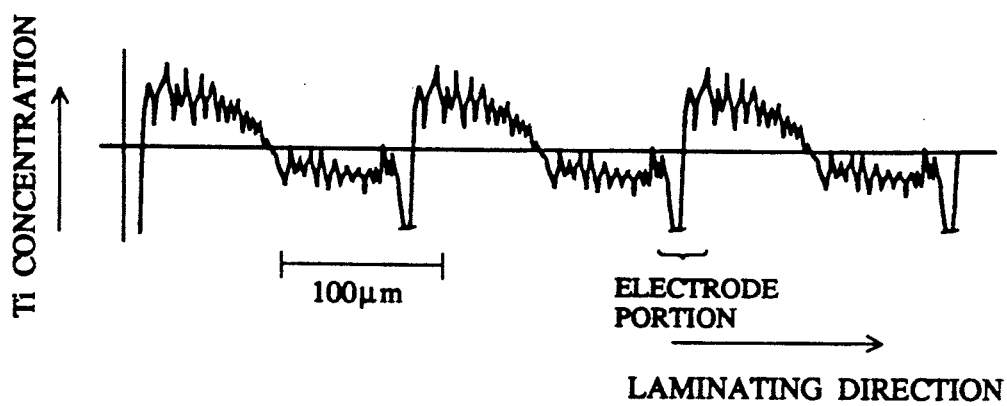
FIG. 10 is a graph showing the change of Ti concentration in the laminating direction of the piezoelectric ceramic laminate device in Example 1 which was measured after burning.
Figure 11:
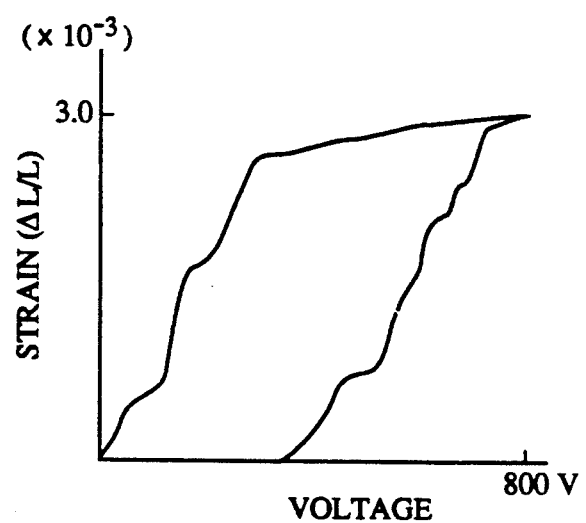
FIG. 11 is a graph showing a hysteresis loop of voltage vs. strain in the piezoelectric ceramic laminate device of Example 1.

Ti concentration of the above piezoelectric ceramic laminate device was measured along the laminating direction. The results are shown in FIG. 10. Also, voltage was applied to the piezoelectric ceramic laminate device to measure its strain. The results are shown in FIG. 11. As is clear from FIG. 11, the strain changed with voltage along a hysteresis loop having a relatively small inclination.

EXAMPLE 2

Three types of green sheets having the following compositions were produced in the same manner as in Example 1:

T$_1$: Pb$_{0.96}$Ba$_{0.03}$Nb$_{0.02}$[(Zr$_{0.65}$Sn$_{0.35}$)$_{0.95}$Ti$_{0.05}$]$_{0.98}$O$_3$,
T$_2$: Pb$_{0.96}$Ba$_{0.03}$Nb$_{0.02}$[(Zr$_{0.65}$Sn$_{0.35}$)$_{0.955}$Ti$_{0.045}$]$_{0.98}$O$_3$, and
T$_3$: Pb$_{0.96}$Ba$_{0.03}$Nb$_{0.02}$[(Zr$_{0.65}$Sn$_{0.35}$)$_{0.96}$Ti$_{0.04}$]$_{0.98}$O$_3$.

Figure 12:
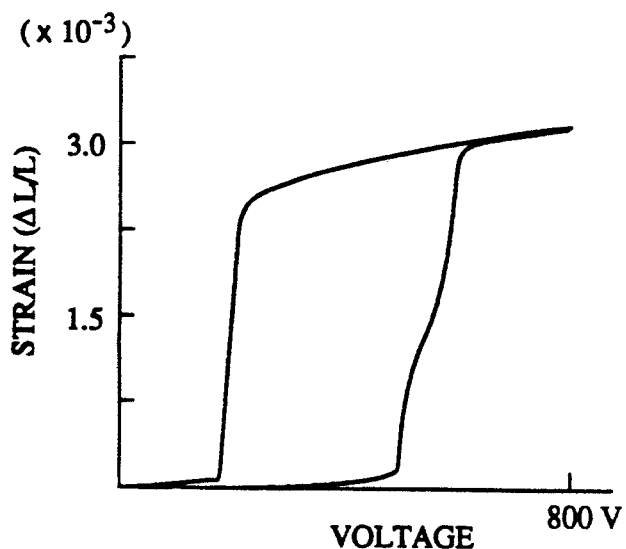
FIG. 12 is a graph showing a hysteresis loop of voltage vs. strain in the piezoelectric ceramic laminate device of Example 2.

A piezoelectric ceramic laminate device was produced in the same manner as in Example 1 except that the three types of green sheets were laminated repeatedly in the order of T$_1$, T$_2$, T$_3$, T$_2$, T$_1$ .... Voltage was applied to the piezoelectric ceramic laminate device to measure its strain. The results are shown in FIG. 12.

EXAMPLE 3

Five types of green sheets each having a thickness of about 100 μm and the following composition were produced in the same manner as in Example 1 (step (a)):

T$_1$: Pb$_{0.96}$Ba$_{0.03}$Nb$_{0.02}$[(Zr$_{0.65}$Sn$_{0.35}$)$_{0.9725}$Ti$_{0.0275}$]$_{0.98}$O$_3$,
T$_2$: Pb$_{0.96}$Ba$_{0.03}$Nb$_{0.02}$[(Zr$_{0.65}$Sn$_{0.35}$)$_{0.96875}$Ti$_{0.03125}$]$_{0.98}$O$_3$,
T$_3$: Pb$_{0.96}$Ba$_{0.03}$Nb$_{0.02}$[(Zr$_{0.65}$Sn$_{0.35}$)$_{0.965}$Ti$_{0.035}$]$_{0.98}$O$_3$,
T$_4$: Pb$_{0.96}$Ba$_{0.03}$Nb$_{0.02}$[(Zr$_{0.65}$Sn$_{0.35}$)$_{0.96125}$Ti$_{0.03875}$]$_{0.98}$O$_3$, and
T$_5$: Pb$_{0.96}$Ba$_{0.03}$Nb$_{0.02}$[(Zr$_{0.65}$Sn$_{0.35}$)$_{0.9575}$Ti$_{0.0425}$]$_{0.98}$O$_3$.

Figure 7:
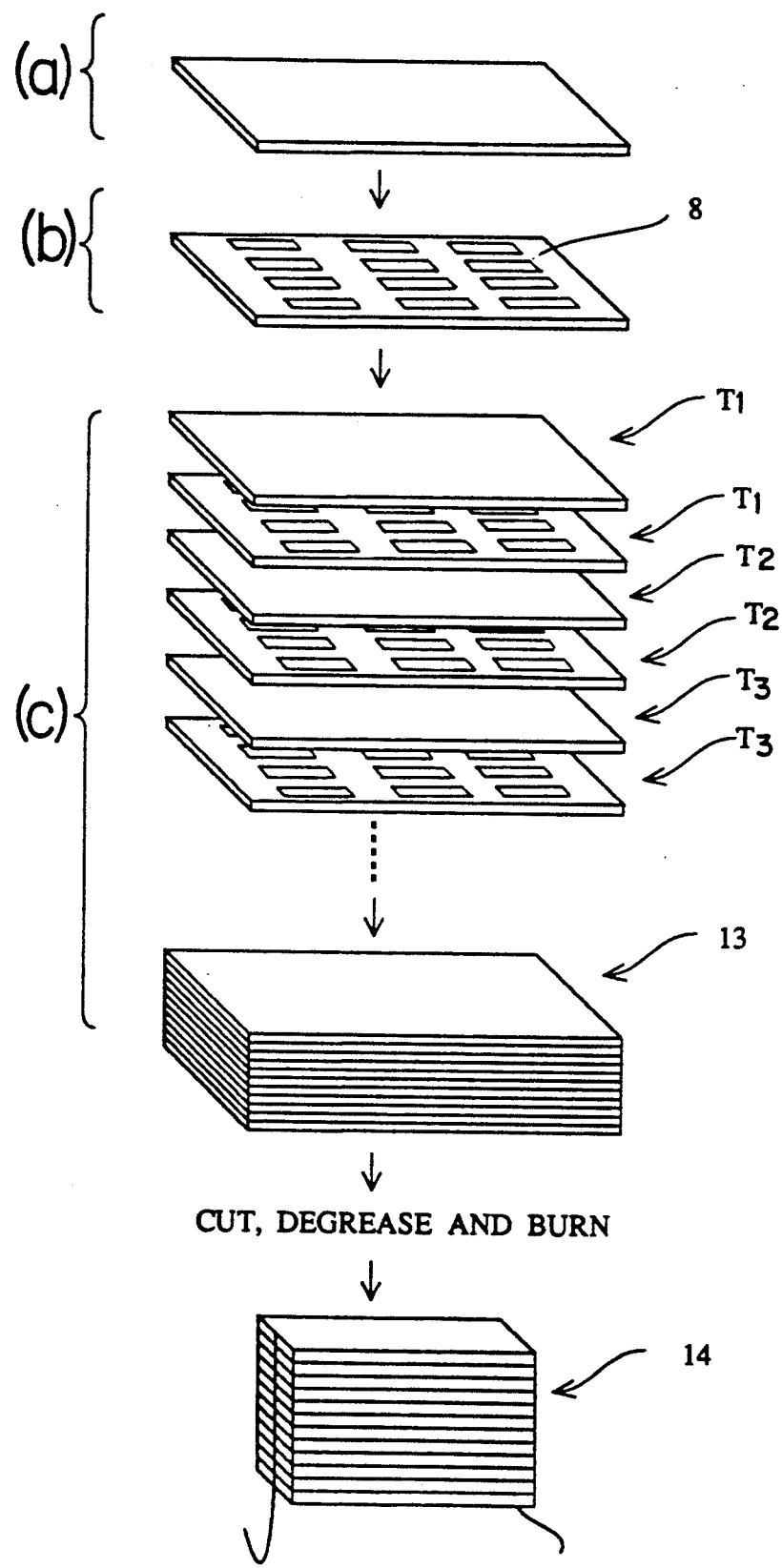
FIG. 7 is a schematic illustration of the procedure of producing the piezoelectric ceramic laminate device according to another embodiment of the present invention.

As shown in FIG. 7, a platinum electrode 8 having a dry thickness of about 6 μm was formed on each surface of the above five sheets in the same manner as in Example 1 (step (b)). Two green sheets of the same composition, one having an electrode 8 thereon and the other not, were bonded together by compression so that one electrode was disposed between the two same sheets.

The resulting five types of bonded green sheets (T$_1$+T$_1$), ... were laminated in the order of (T$_1$+T$_1$), (T$_2$+T$_2$), (T$_3$+T$_3$), (T$_4$+T$_4$), (T$_5$+T$_5$), (T$_4$+T$_4$), (T$_3$+T$_3$), (T$_2$+T$_2$), (T$_1$+T$_1$), ... and a load of 160 kg/cm$^2$ was applied to the resulting laminate at 120° C. to bond all the green sheets together (step (c)). Then, the resulting laminates 13 were cut in the laminating direction to have a size of a 5-mm length, 10-mm width and 8-mm thickness. The laminates 13 were degreased under the conditions shown in FIG. 8. The degreased laminates were burned at 1020° C., 1100° C. and 1200° C., respectively for 3 hours in the air. Then, a lead wire 40 was connected to each electrode 8 in each of the burned laminates to obtain aimed piezoelectric ceramic laminate devices 14 as shown in FIG. 4.

Figure 13A:
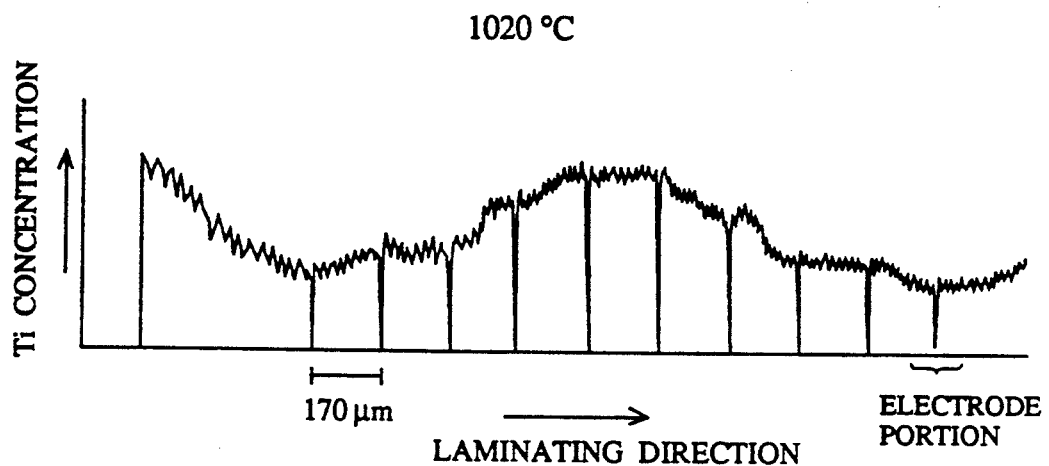
FIG. 13 (a) is a graph showing the change of Ti concentration in the laminating direction of the piezoelectric ceramic laminate device of Example 3 which was burned at 1020° C.
Figure 13B:
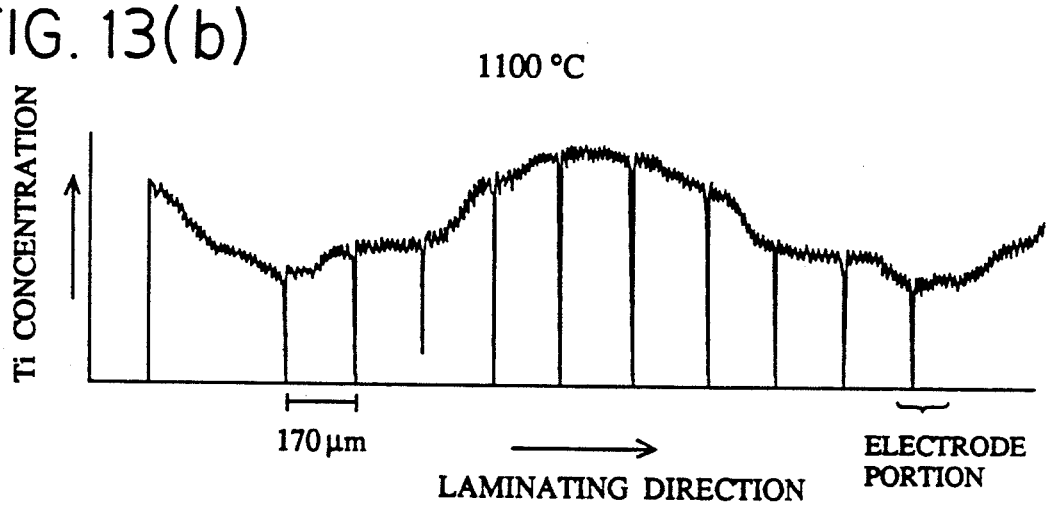
Figure 13C:
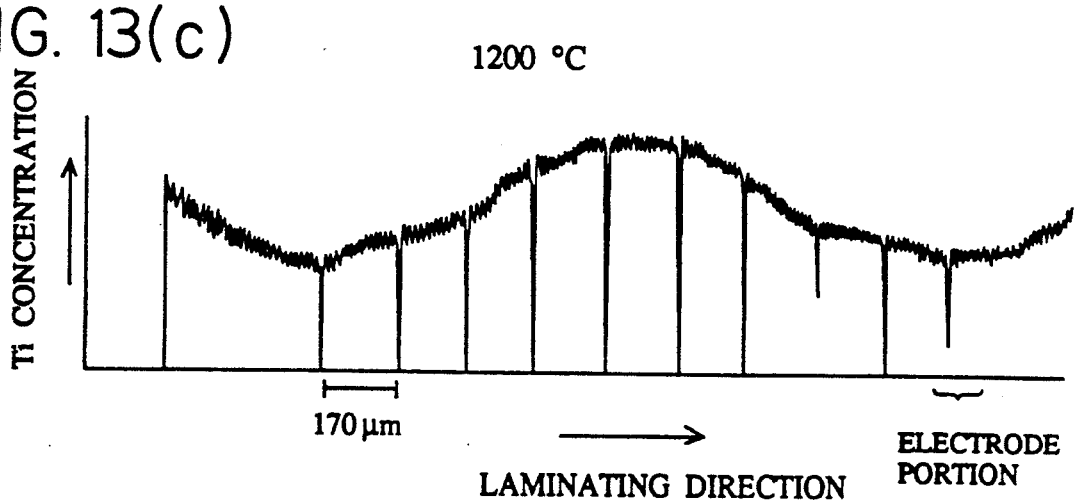

Ti concentration in the laminating direction was measured on each of the above piezoelectric ceramic laminate devices by EPMA. The results are shown in FIG. 13. In FIG. 13, (a) shows the Ti concentration of the piezoelectric ceramic laminate device which was burned at 1020° C., (b) shows that of the piezoelectric ceramic laminate device which was burned at 1100° C., and (c) shows that of the piezoelectric ceramic laminate device which was burned at 1200° C. As is clear from FIGS. 13(a)–(c), the Ti concentration changes most smoothly along a sinusoidal curve in the case of (c) in which burning was conducted at 1200° C.

Figure 14:
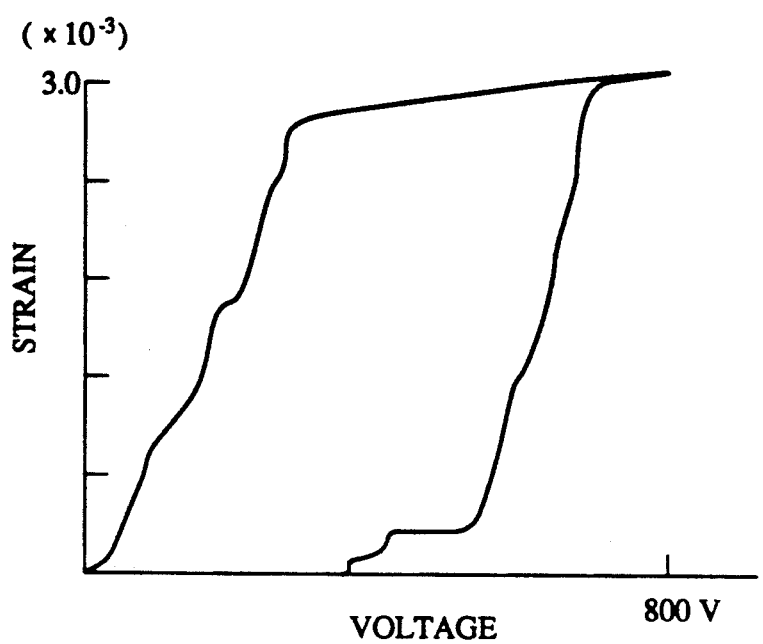
FIG. 14 is a graph showing a hysteresis loop of voltage vs. strain in the piezoelectric ceramic laminate device of Example 3.

Voltage was applied to the piezoelectric ceramic laminate device burned at 1200° C. to measure its strain. The results are shown in FIG. 14. As is clear from FIG. 14, the strain changed with voltage along a hysteresis loop having a relatively small inclination.

As described above in detail, since the piezoelectric ceramic laminate device according to the present invention shows a strain which slowly changes as the voltage applied increases, and since the hysteresis loop of the strain vs. voltage is slim, it is possible to control the strain to a predetermined level by adjusting the voltage applied in the piezoelectric ceramic laminate device of the present invention. In other words, analog control of strain can be conducted in the piezoelectric ceramic laminate device of the present invention. Such piezoelectric ceramic laminate devices are suitable for actuators usable in various control devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A piezoelectric ceramic laminate device comprising a plurality of piezoelectric ceramic sheets, wherein the concentration of at least one metal component constituting said piezoelectric ceramic sheets changes in the laminating direction thereof substantially along a sinusoidal curve.

2. A piezoelectric ceramic laminate device comprising a plurality of piezoelectric ceramic sheets, wherein said piezoelectric ceramic sheets are made of Pb-Nb-Zr-Sn-Ti oxides having a composition represented by the general formula:

$$Pb_\alpha Ba_\beta Nb_\gamma[(Zr_\delta Sn_\epsilon)_{1-\zeta}Ti_\zeta]_\eta O_3,$$

wherein $\alpha$, $\beta$, $\gamma$, $\delta$, $\epsilon$, $\zeta$ and $\eta$ respectively satisfy, by atomic ratio, $0.94<\alpha<1$, $0<\beta<0.06$, $0<\gamma<0.04$, $0.55<\delta<0.75$, $0.25<\epsilon<0.45$, $0<\zeta<0.08$ and $0.96<\eta<1$, and wherein the concentration of at least one metal component comprising said piezoelectric ceramic sheets changes substantially smoothly in the laminating direction thereof.

3. The piezoelectric ceramic laminate device according to claim 2, wherein a Ti concentration changes substantially smoothly in the laminating direction.

4. The piezoelectric ceramic laminate device according to claim 3, wherein the concentration of Ti changes substantially along as sinusoidal curve.

5. The piezoelectric ceramic laminate device according to claim 3, wherein the concentration of Ti changes substantially linearly.

6. The piezoelectric ceramic laminate device according to claim 2, wherein the concentration of at least one metal component changes substantially along a sinusoidal curve.

7. The piezoelectric ceramic laminate device according to claim 2, wherein the concentration of at least one metal component changes substantially linearly.

8. A piezoelectric ceramic laminate device comprising a plurality of piezoelectric ceramic sheets having a smoothly changing concentration of at least one metal component in the laminating direction thereof, said piezoelectric ceramic sheets being produced by burning laminated green sheets having the same composition except for the concentration of the at least one metal component which changes in the laminating direction of said laminated green sheets.

9. The piezoelectric ceramic laminate device according to claim 8, wherein said piezoelectric ceramic sheets are made of Pb-Nb-Zr-Sn-Ti oxides.

10. The piezoelectric ceramic laminate device according to claim 9, wherein a Ti concentration changes in the laminating direction of said laminated green sheets.

* * * * *